(12) United States Patent
Hsieh

(10) Patent No.: US 8,105,903 B2
(45) Date of Patent: Jan. 31, 2012

(54) METHOD FOR MAKING A TRENCH MOSFET WITH SHALLOW TRENCH STRUCTURES

(75) Inventor: Fu-Yuan Hsieh, Kaohsiung (TW)

(73) Assignee: Force MOS Technology Co., Ltd., Banciao (TW)

( * ) Notice: Subject to any disclaimer, the term of this patent is extended or adjusted under 35 U.S.C. 154(b) by 207 days.

(21) Appl. No.: 12/585,645

(22) Filed: Sep. 21, 2009

(65) Prior Publication Data

US 2011/0070708 A1    Mar. 24, 2011

(51) Int. Cl.
H01L 21/336 (2006.01)

(52) U.S. Cl. .................. 438/270; 438/269

(58) Field of Classification Search .......... 438/270
See application file for complete search history.

(56) References Cited

U.S. PATENT DOCUMENTS

| | | | | |
|---|---|---|---|---|
| 5,100,823 A * | 3/1992 | Yamada | ........ | 438/243 |
| 5,424,231 A * | 6/1995 | Yang | ........ | 438/270 |
| 6,664,163 B2 * | 12/2003 | Fujishima et al. | ........ | 438/270 |
| 6,764,906 B2 * | 7/2004 | Darwish | ........ | 438/270 |
| 6,921,697 B2 * | 7/2005 | Darwish et al. | ........ | 438/270 |
| 7,033,876 B2 * | 4/2006 | Darwish et al. | ........ | 438/212 |
| 7,081,388 B2 * | 7/2006 | Jones | ........ | 438/270 |
| 7,118,953 B2 * | 10/2006 | Darwish | ........ | 438/199 |
| 7,358,190 B2 * | 4/2008 | Kim et al. | ........ | 438/694 |
| 7,504,303 B2 * | 3/2009 | Yilmaz et al. | ........ | 438/259 |
| 7,648,877 B2 * | 1/2010 | Andrews | ........ | 438/270 |
| 7,767,530 B2 * | 8/2010 | Cho | ........ | 438/270 |
| 7,859,047 B2 * | 12/2010 | Kraft et al. | ........ | 257/330 |
| 2001/0008788 A1 * | 7/2001 | Hshieh et al. | ........ | 438/270 |
| 2001/0026989 A1 * | 10/2001 | Thapar | ........ | 438/400 |
| 2003/0032248 A1 * | 2/2003 | Yue et al. | ........ | 438/270 |
| 2003/0235958 A1 * | 12/2003 | Chan et al. | ........ | 438/270 |
| 2004/0121572 A1 * | 6/2004 | Darwish et al. | ........ | 438/589 |
| 2004/0166636 A1 * | 8/2004 | Darwish | ........ | 438/270 |
| 2005/0191809 A1 * | 9/2005 | Kinzer | ........ | 438/268 |
| 2005/0215011 A1 * | 9/2005 | Darwish et al. | ........ | 438/270 |
| 2006/0289929 A1 * | 12/2006 | Andrews | ........ | 257/330 |
| 2007/0190728 A1 * | 8/2007 | Sreekantham et al. | ........ | 438/270 |
| 2008/0150015 A1 * | 6/2008 | Cho | ........ | 257/330 |
| 2008/0169505 A1 * | 7/2008 | Hsieh | ........ | 257/331 |
| 2008/0211014 A1 * | 9/2008 | Zeng | ........ | 257/330 |
| 2009/0026534 A1 * | 1/2009 | Yeh et al. | ........ | 257/330 |
| 2009/0050959 A1 * | 2/2009 | Madson | ........ | 257/332 |
| 2010/0084705 A1 * | 4/2010 | Radic et al. | ........ | 257/330 |
| 2010/0320534 A1 * | 12/2010 | Pan et al. | ........ | 257/334 |
| 2011/0068389 A1 * | 3/2011 | Hsieh | ........ | 257/330 |
| 2011/0121386 A1 * | 5/2011 | Hsieh | ........ | 257/334 |

* cited by examiner

*Primary Examiner* — Wael Fahmy
*Assistant Examiner* — Grant Withers
(74) *Attorney, Agent, or Firm* — Bacon & Thomas, PLLC

(57) ABSTRACT

A method for making a trench MOSFET with shallow trench structures with a thick trench bottom is disclosed. The improved method resolves the problem of deterioration of breakdown voltage resulted by LOCOS having a bird's beak shape introduced in prior art, and at the same time, the inventive device has a lower Qgd and lower Rds.

13 Claims, 18 Drawing Sheets

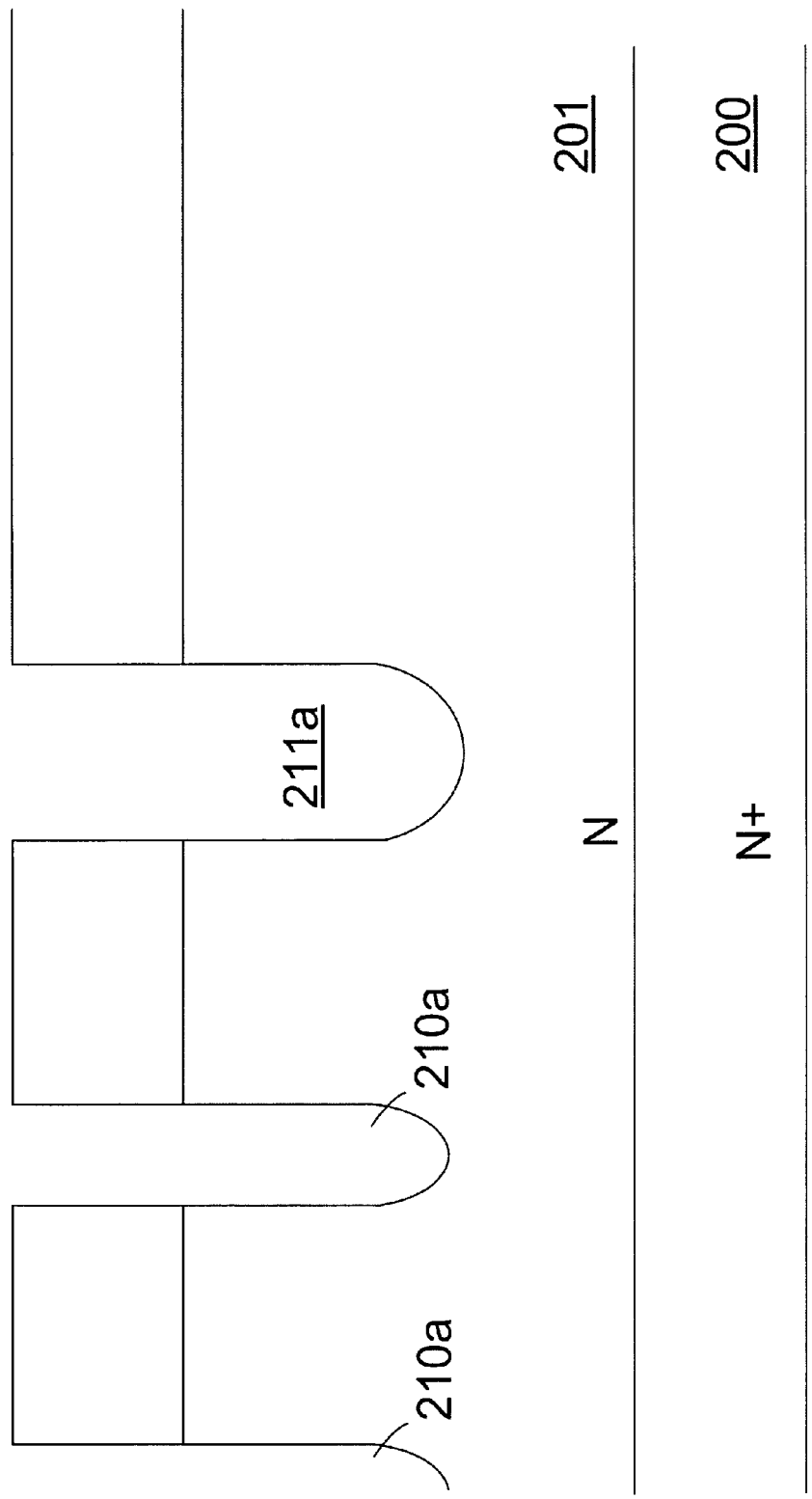

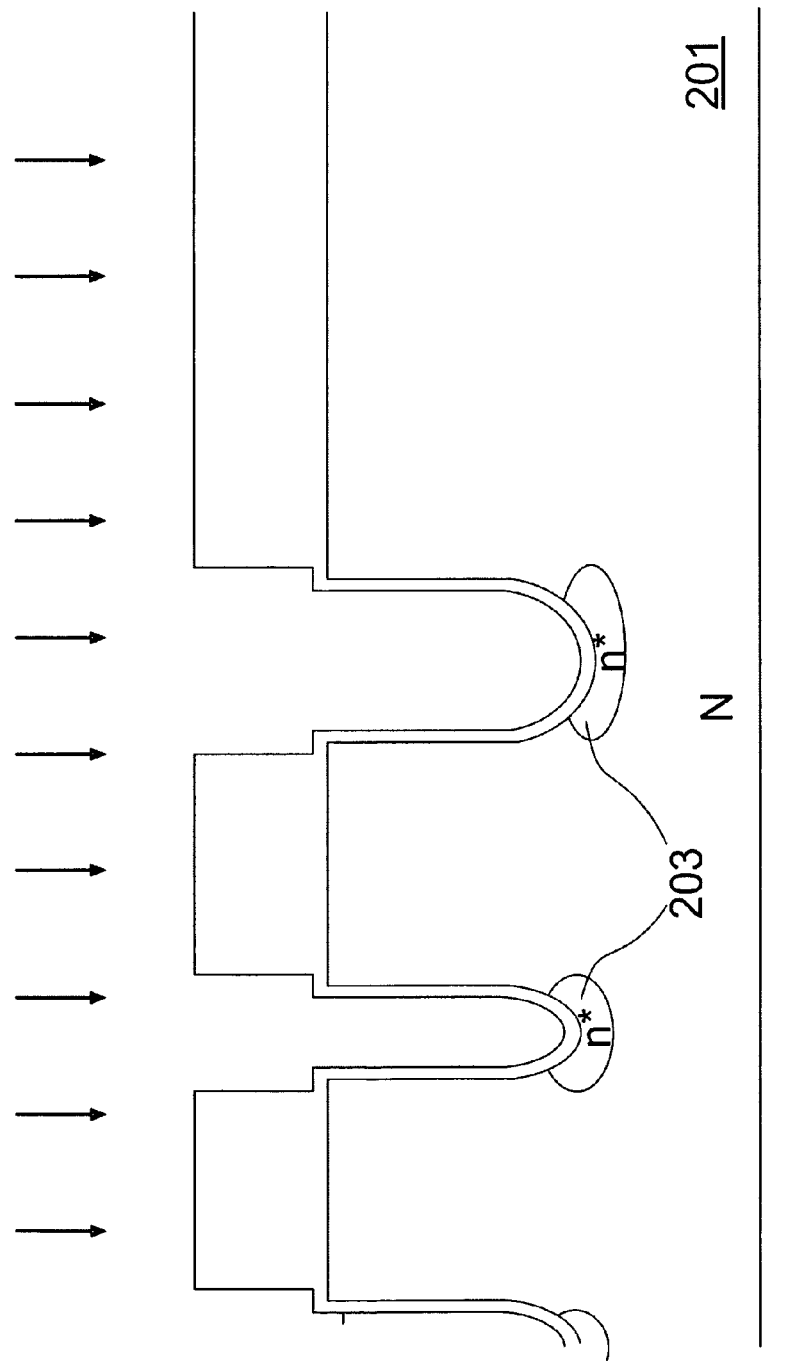

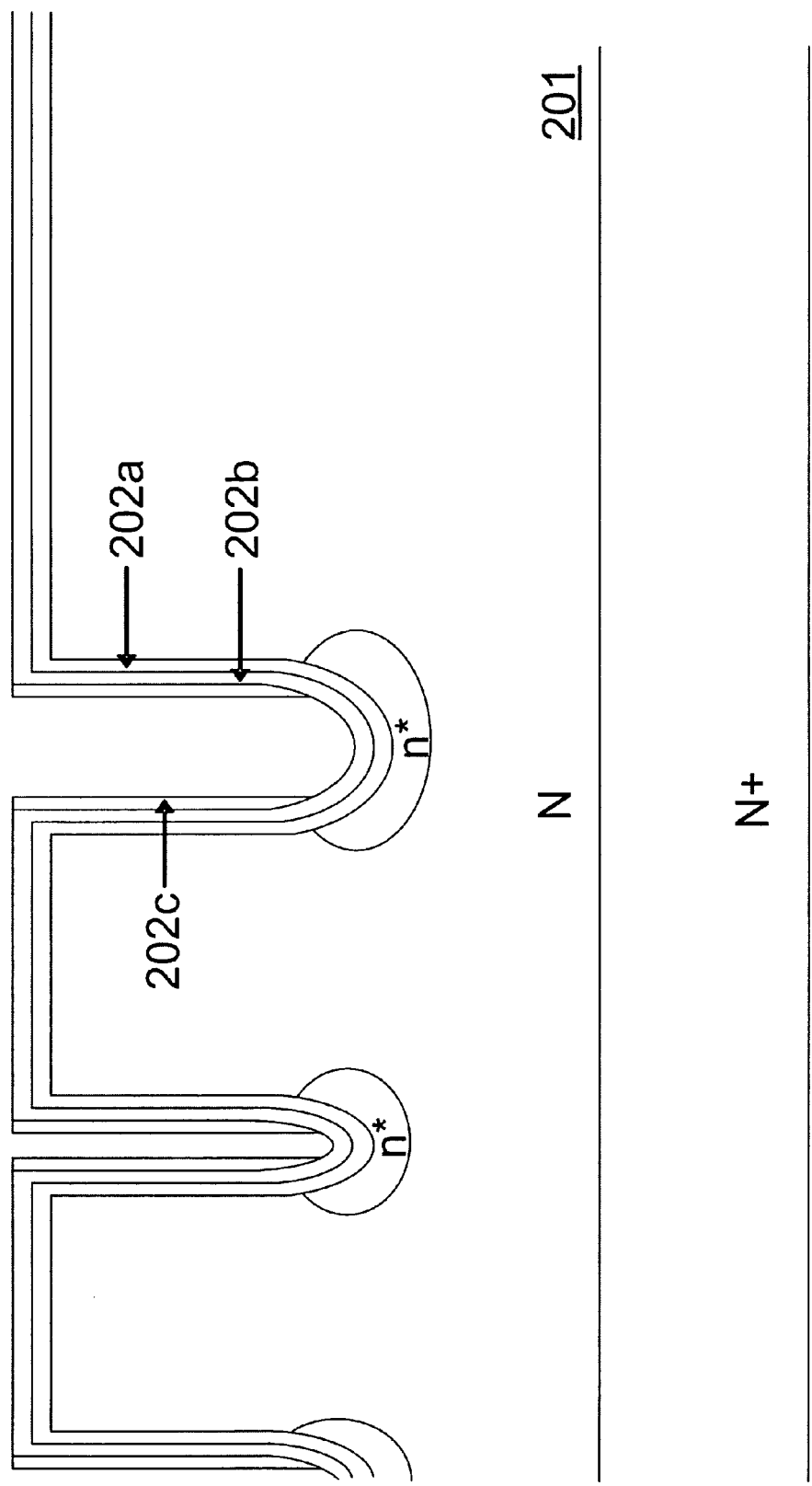

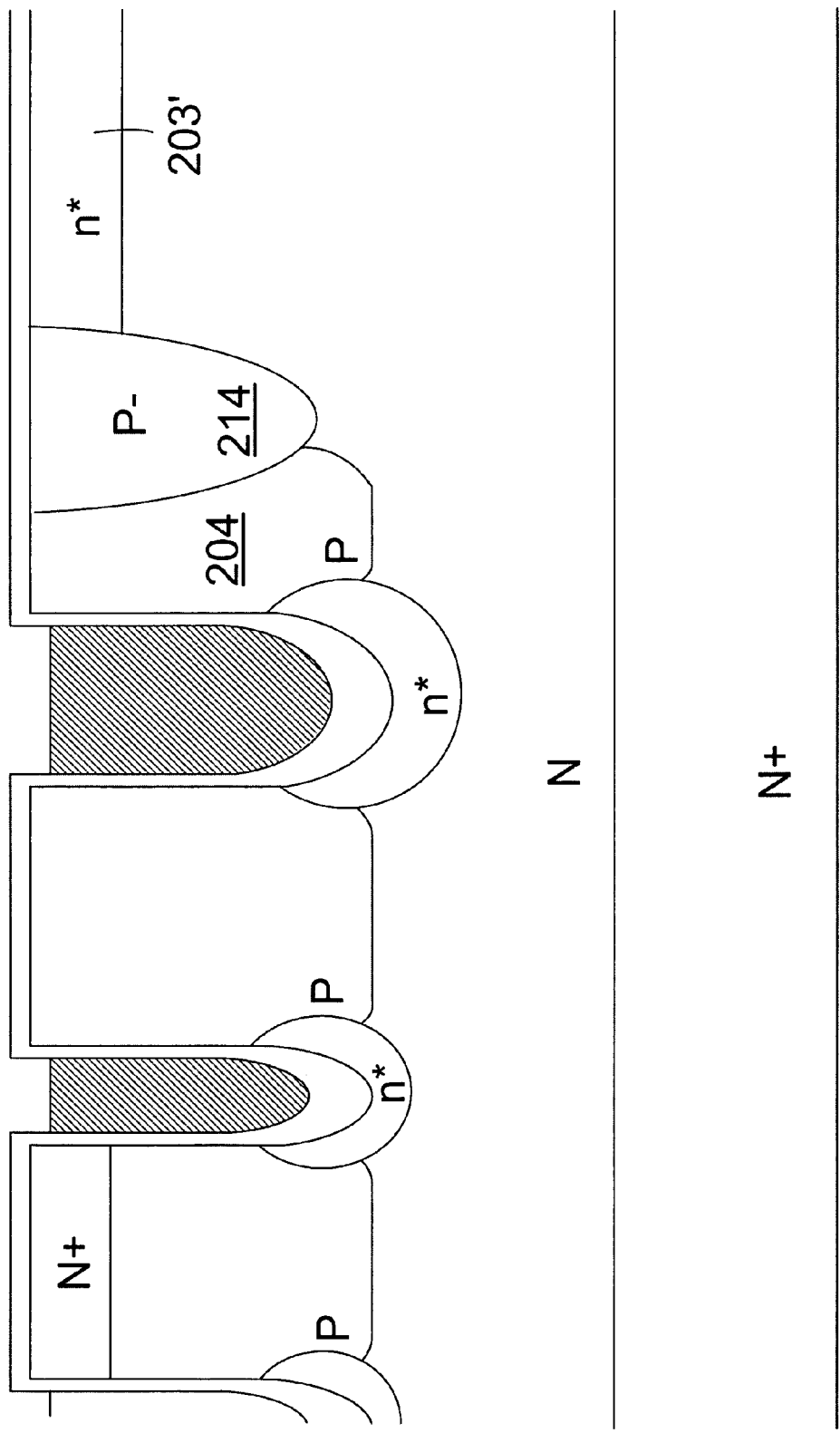

METHOD FOR MAKING A TRENCH MOSFET WITH SHALLOW TRENCH STRUCTURES

BACKGROUND OF THE INVENTION

1. Field of the Invention

This invention relates generally to the cell configuration and fabrication process of Power MOSFET devices. More particularly, this invention relates to a novel and improved trench MOSFET cell structure, and improved process of fabricating a trench MOSFET with shallow trench structures.

2. The Prior Arts

In order to resolve restrict of a high gate charge introduced in a trench MOSFET of conventional configurations, a shallow trench structure was disclosed by decreasing a trench depth, please refer to FIG. 1A for an N-channel trench MOSFET of prior art. However, when forming the shallow trench structure during fabrication process, a trenched gate contact 109 into a shallow trenched gate may penetrate through a gate oxide and short to a drain because the Cdpoly (trenched gate contact depth, as shown in FIG. 1A) is about 1.5 times deeper than Cdsi (trenched source-body contact depth into an epitaxial layer, as shown in FIG. 1A) as the result of faster etching rate in a doped poly silicon than in a silicon layer.

Another disadvantage of the prior art is that, as illustrated in FIG. 2 (the upper curve), to prevent the increase of Rds (Resistance between Drain and Source), a difference between Td (Trench depth, FIG. 1A) and Pd (P body depth, FIG. 1A) must be kept larger than 0.4 μm, thus forming a large overlap region between the trenched gate and the epitaxial layer, therefore greatly increasing Qgd (gate to drain charge, FIG. 1A).

To further reduce Qgd, a trench MOSFET with a thick bottom oxide of prior art (U.S. Pat. No. 5,126,807) was disclosed, as shown in FIG. 1B. However, according to the prior art, the thick bottom oxide 129 is formed by LOCOS (Local Oxidation of Silicon underneath a trench bottom) having a bird's beak region 131 with a nitride layer 130 on sidewalls of the trenches, resulting in a deterioration of a breakdown voltage as result of a weak corner oxide formed in the trench bottom.

Accordingly, it would be desirable to provide a novel trench MOSFET with shallow trench structure and improved fabrication process to maintain lower Rds, lower Qgd and higher breakdown voltage.

SUMMARY OF THE INVENTION

It is therefore an object of the present invention to provide a new and improved power MOSFET with shallow trench structure and a thick trench bottom oxide and fabrication process to resolve the problems mentioned above One aspect of the present invention is that, an additional doped region with the same conductivity doping type as an epitaxial layer but having a higher doping concentration is formed wrapping each of shallow trenched gate bottoms to achieve lower Qgd without significantly increasing Rds. Please refer to FIG. 2 again for two different simulated relationship of an N-channel trench MOSFET, from which we can see that, the Rds of the N-channel trench MOSFET is significantly reduced with introduction of Arsenic (As) doped regions for on-resistance reduction underneath the shallow trenched gate bottoms. In FIG. 3, the dashed line represents the doping concentration along a channel region of the N-channel trench MOSFET, indicating that the doping concentration of the As doped regions (n* area) of the N-channel trench MOSFET is heavier than that of the epitaxial layer.

Another aspect of the present invention is that, the shallow trenched gates are formed with a thick trench bottom insulation layer, for example, with a thick trench bottom oxide by oxidizing an un-doped poly silicon (deposited at 650° C. or above) or amorphous silicon (deposited below 650° C.) on top of a gate oxide at the trench bottom. By employing this structure, the Qgd of the trench MOSFET can be further reduced without having degradation of the breakdown voltage due to the bird's beak issue of the prior art.

Another aspect of the present invention is that, in a fabrication process, source-body contact trenches and at least a gate contact trench are defined by two different contact masks to avoid the over-etching issue which happens when using a single contact mask for the source-body contact trenches and gate contact trenches, thus preventing the gate/drain shortage from happening.

Another aspect of the present invention is that, in some preferred embodiment, when carrying out the ion implantation for the additional doped regions wrapping the trenched gate bottoms, a hard mask is used to block the ion implantation in a termination area to avoid the degradation of the breakdown voltage.

Another aspect of the present invention is that, in some preferred embodiment, a guard ring ion implantation with dose less than a body region ion implantation in the fabrication process is added in a termination area to further avoid the degradation of the breakdown voltage.

Briefly, in a preferred embodiment, as shown in FIG. 4, the present invention discloses a trench MOSFET with trench bottoms wrapped by additional doped regions having a heavier doping concentration than an epitaxial layer. The trench MOSFET is formed on a heavily doped substrate of a first conductivity doping type onto which a lightly doped epitaxial layer of the same first conductivity doping type is grown. A plurality of trenched gates and at least a wider trenched gate for gate connection are formed within the epitaxial layer and filled with a doped poly silicon layer padded by a first insulation layer, for example, an oxide layer. Especially, the oxide layer on trench bottom portion is thicker than that along trench sidewalls to further reduce Qgd. Around the bottom of each the trenched gate, a doped region of the first conductivity doping type is formed within the epitaxial layer, furthermore, the doped region has a heavier doping concentration than the epitaxial layer. Between every two adjacent trenched gates, body regions of a second conductivity doping type are formed below source regions heavily doped with the first conductivity doping type. Through a second insulation layer deposited over the epitaxial layer, trenched source-body contacts are formed by penetrating the source region and extending into the body region to connect the body region, the source region, to a source metal, while at least a trenched gate contact is formed extending into the wider trenched gate to connect the wider trenched gate, to a gate metal. Underneath the bottom of each the trenched source-body contact, a body contact region is formed heavily doped with the second conductivity doping type to further reduce contact resistance. At the same time, the gate metal is serving as a metal field plate for a termination area which is beyond the body region and overlaps the epitaxial layer surface ranging from 2 to 10 μm.

Briefly, in another preferred embodiment, as shown in FIG. 5, the invention discloses a trench MOSFET similar to that in FIG. 4 except that, in FIG. 5, the termination area has the trench bottom doped region near the top surface of the epitaxial layer, and the metal field plate is beyond the body region and overlaps the epitaxial layer surface ranging from 2 to 10 μm, which can alleviate the degradation of the breakdown voltage caused by the trench bottom doped region on top surface of the epitaxial layer in the termination area.

Briefly, in another preferred embodiment, as shown in FIG. 6, the invention discloses a trench MOSFET similar to that in FIG. 5 except that, the termination area in FIG. 6 has a guard ring which is lightly doped with the second conductivity doping type between the body region and the trench bottom doped region underneath the metal field plate.

This invention further comprises a method for making a trench MOSFET with a thick trench bottom oxide wherein the method further comprises: forming a first insulation layer along an inner surface of a plurality of gate trenches and a top surface of an epitaxial layer; depositing a layer of un-doped poly silicon or amorphous silicon onto the first insulation layer; depositing a layer of nitride onto the un-doped poly silicon or amorphous silicon and carrying out an nitride anisotropic etch to leave the nitride only on trench sidewalls of the gate trenches; oxidizing the un-doped poly silicon or amorphous silicon on trench bottoms of the gate trenches and the top surface of the epitaxial layer. In some preferred embodiment, the method further comprises a method for making a guard ring after the formation of a plurality of trenched gates and before applying a body mask for the formation of a body region. In some preferred embodiment, the method further comprises a method for making a trench bottom doped region only around the bottom of each the trenched gate by applying a hard mask before the formation of the gate trenches and removing after the trench bottom ion implantation. In some preferred embodiment, the method further comprises a method for making a trench bottom doped region around the bottom of each the trenched gate and near the top surface of the epitaxial layer in a termination area by applying a hard mask before the formation of the gate trenches and removing before the trench bottom ion implantation.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 7A to 7H are a serial of side cross sectional views for showing the processing steps for fabricating a shallow trench MOSFET as shown in FIG. 4.

FIG. 9 is a side cross sectional view for showing a few processing steps for fabricating a shallow trench MOSFET as shown in FIG. 6.

DETAILED DESCRIPTION OF THE EMBODIMENTS

Figure 1A:
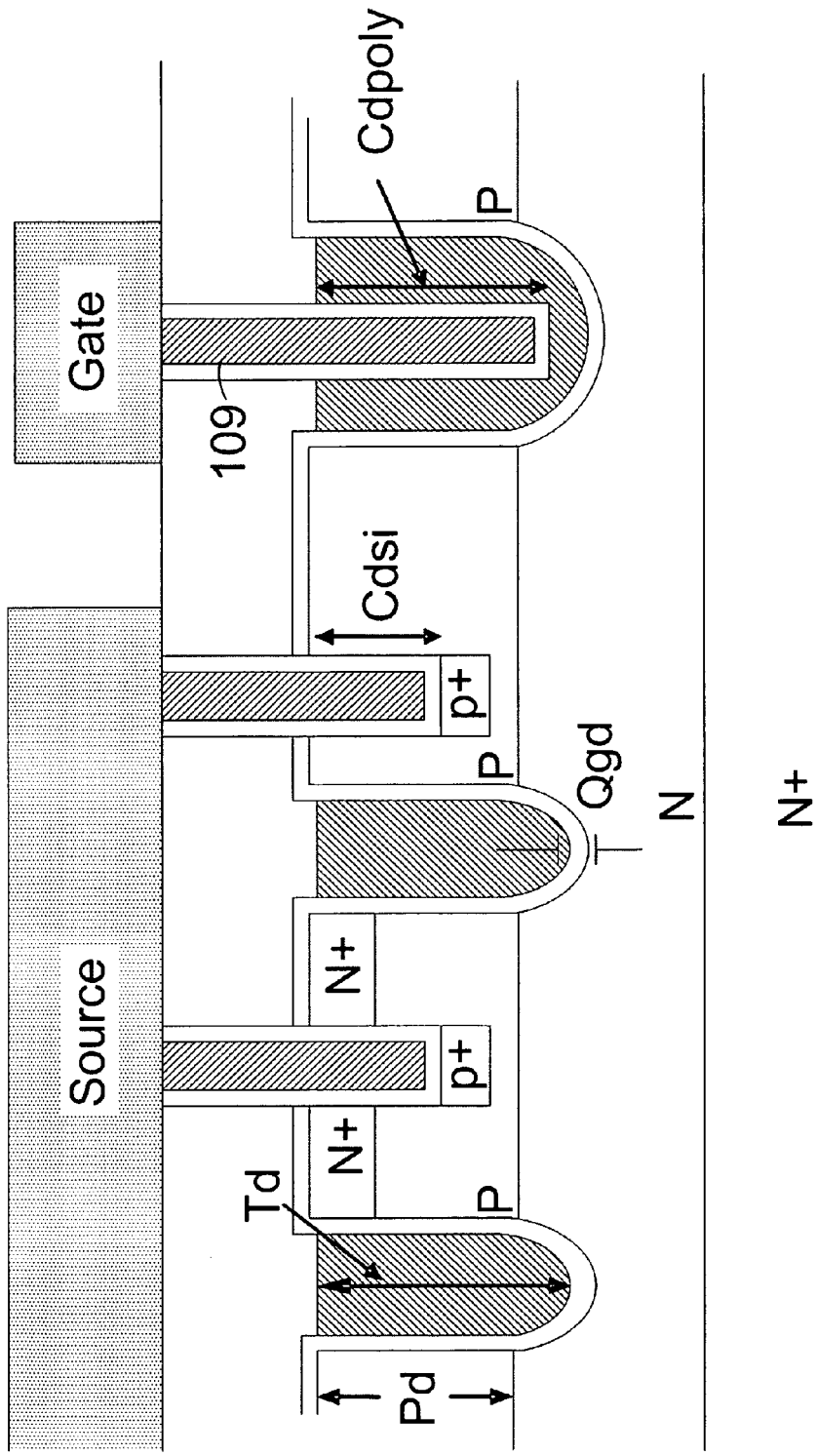
FIG. 1A is a side cross-sectional view of a trench MOSFET of prior art.
Figure 1B:
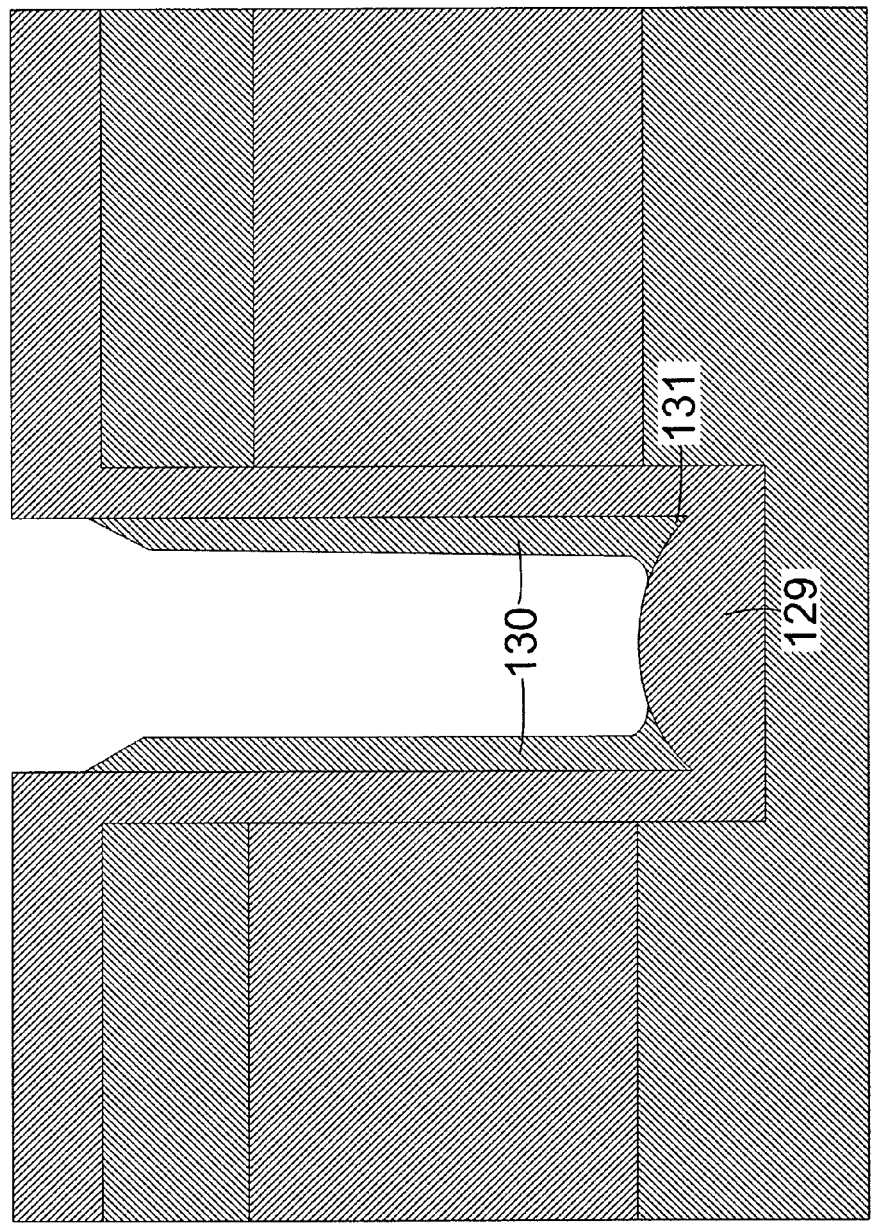
FIG. 1B is a side cross-sectional view of a trench MOSFET with thick trench bottom of prior art.
Figure 2:
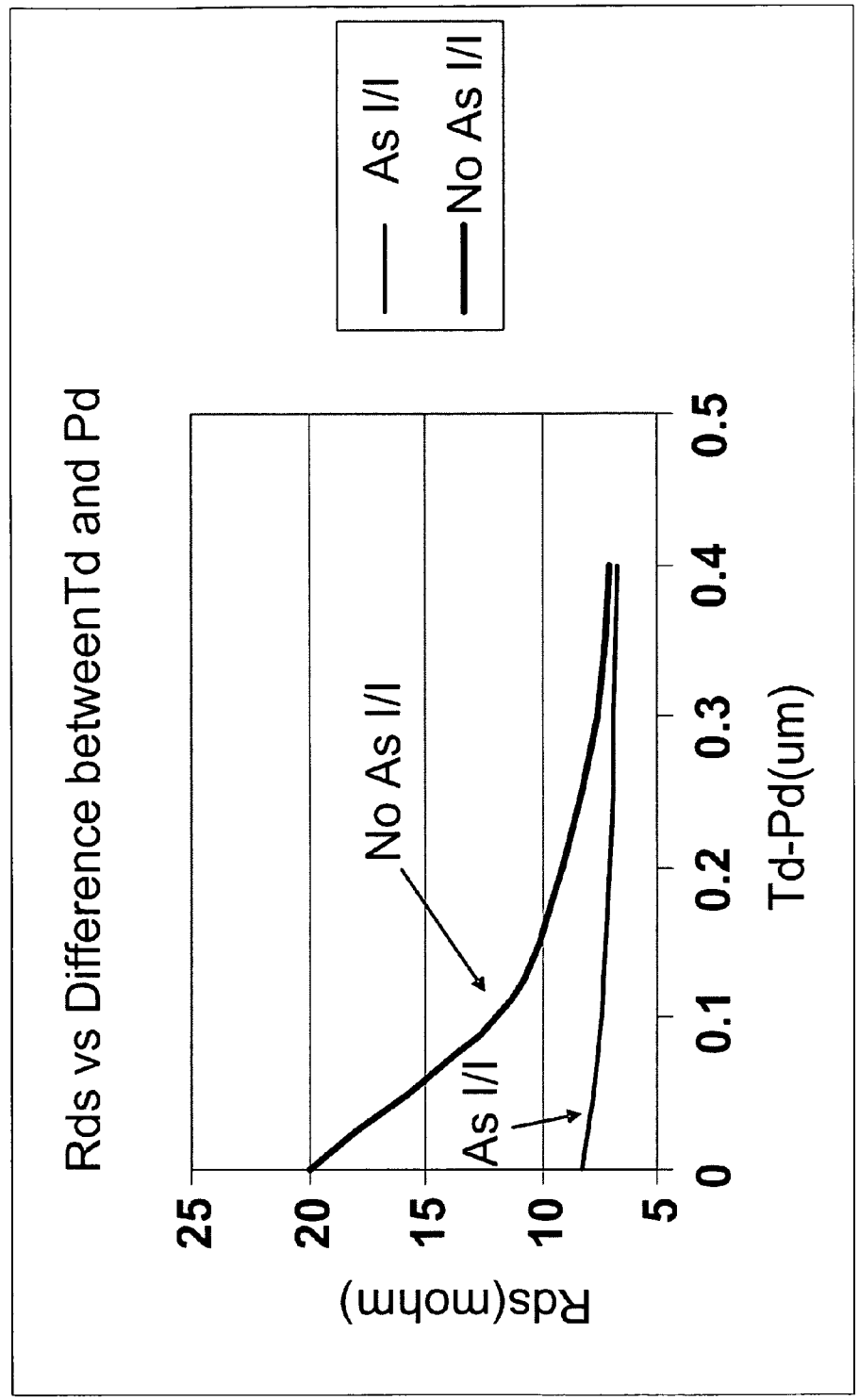
FIG. 2 is a profile showing the dependence of Rds on difference between trench depth and P body depth in an N-channel MOSFET. The upper curve indicates the condition with no As implantation at the bottom of the trench, while the lower one indicates the condition with heavier As implantation around the bottom of the trench for an N-channel trench MOSFET.
Figure 3:
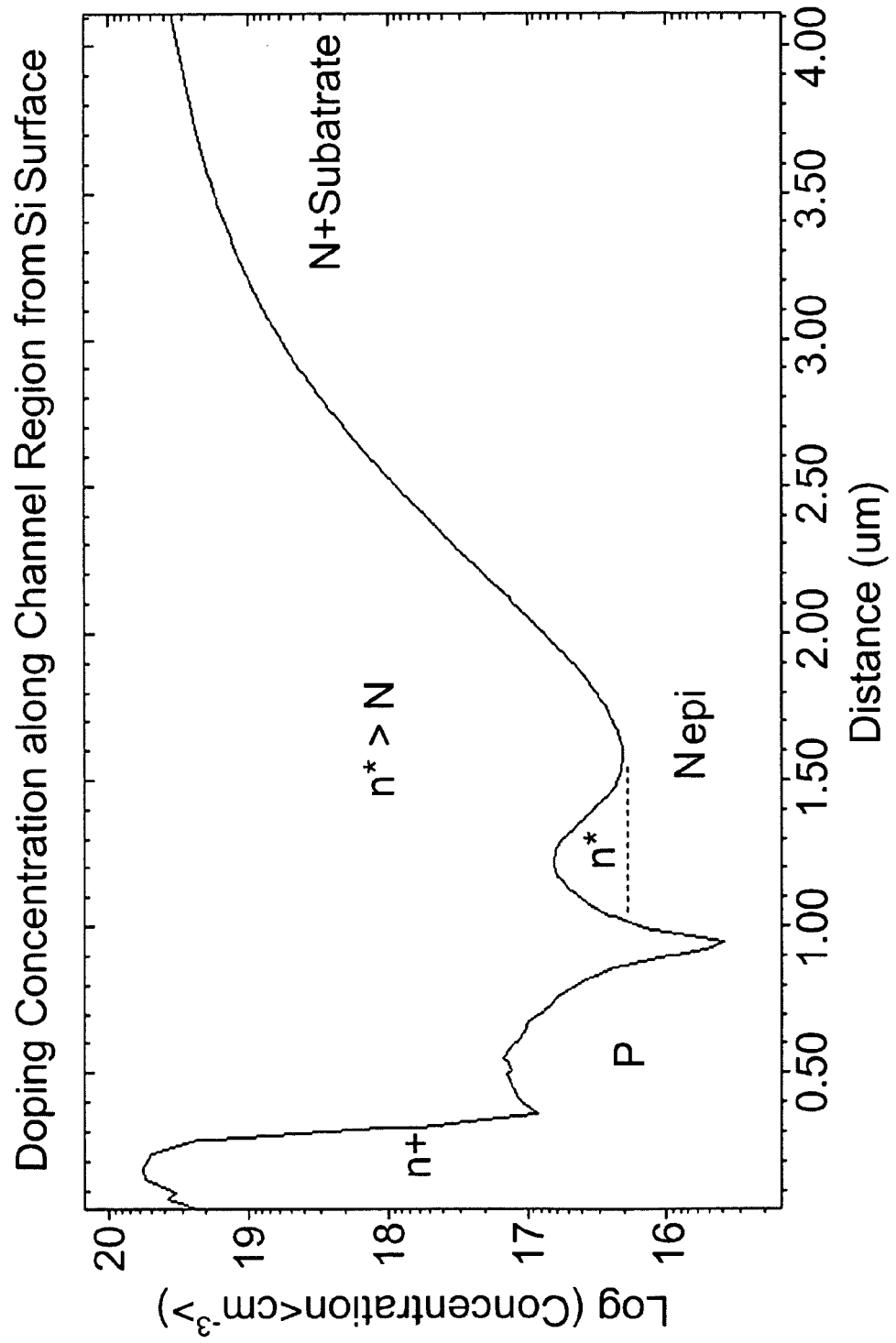
FIG. 3 is a profile illustrating the doping concentration distributed along channel region from silicon surface in an N-channel MOSFET.
Figure 4:
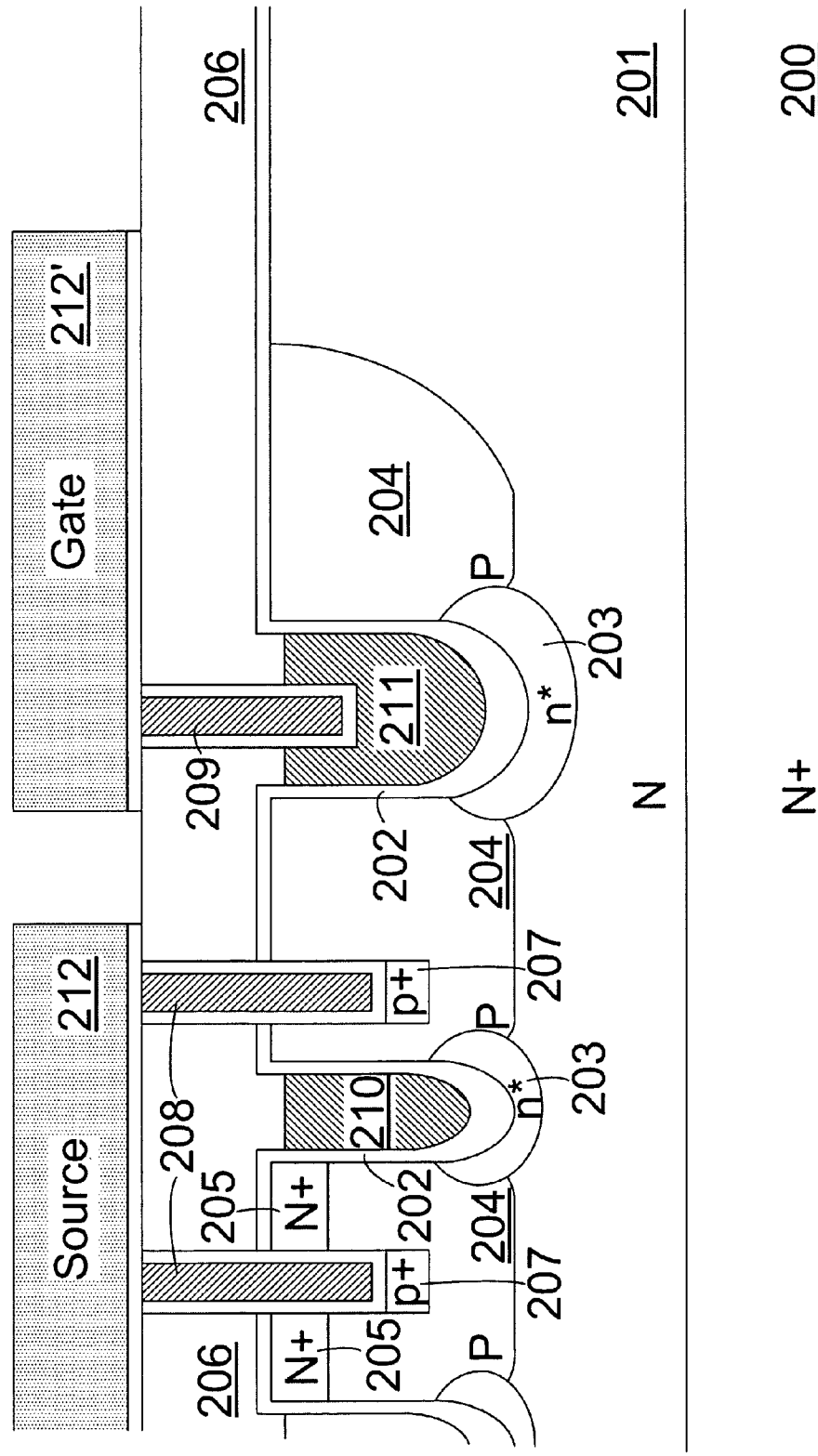
FIG. 4 is a side cross-sectional view of a shallow trench MOSFET of an embodiment according to the present invention.

Please refer to FIG. 4 for a preferred embodiment of this invention where an N-channel trench MOSFET is formed on a heavily N+ doped substrate 200 onto which a lightly N doped epitaxial layer 201 is grown. A plurality of gate trenches are formed within the epitaxial layer and filled with a doped poly silicon layer onto an oxide 202 to form trenched gates 210 and at least a wider trenched gate 211 for gate connection. What should be noticed is that, the oxide layer 202 on the bottom of each of the trenched gates 210 and 211 is thicker than that along the sidewalls. Around the bottom of each the trenched gate 210 and 211, an n* doped region 203 is formed with a heavier doping concentration than the epitaxial layer. An N+ source region 205 is formed near the top surface of a P body region 204 between every two adjacent trenched gates 210. The trench MOSFET further comprises: trenched source-body contacts filled with tungsten plugs 208 penetrating through an insulation layer 206, the source region 205 and extending into the body region 204; a trenched gate contact filled with the tungsten plug 209 penetrating through the insulation layer 206 and extending into the doped poly silicon layer filled in the wider trenched gate 211; a p+ body contact region 207 underneath each the trenched source-body contact. A source metal 212 is connected to the source region 205 and the body region 204 via the trenched source-body contact metal plug 208, while a gate metal 212' is connected to the wider trenched gate 211 via the trenched gate contact metal plug 209, the gate metal also serves as a field metal plate for a termination area and overlaps the epitaxial layer 201 surface ranging from 2 to 10 μm.

Figure 5:
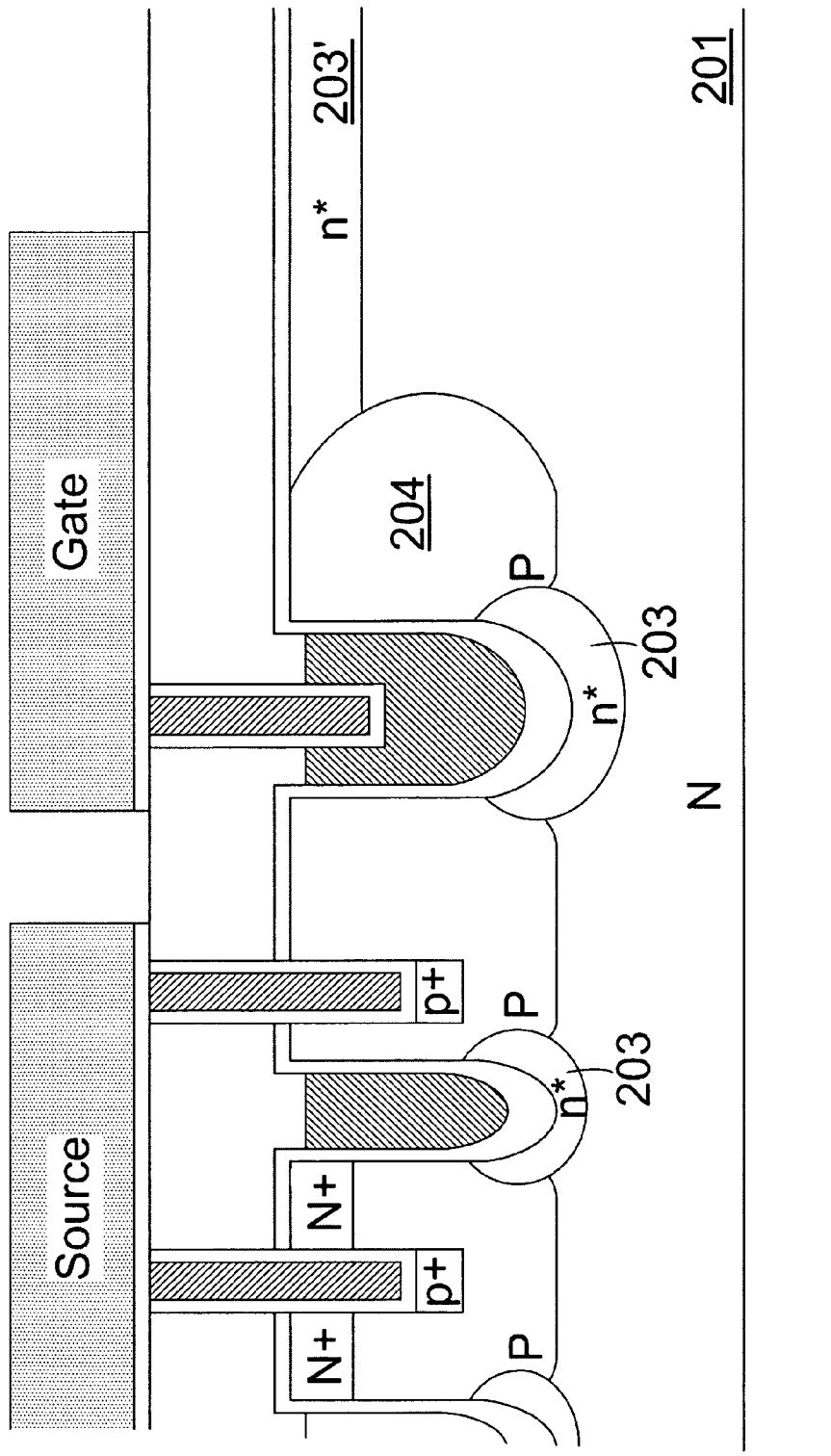
FIG. 5 is a side cross-sectional view of a shallow trench MOSFET of another embodiment according to the present invention.

FIG. 5 shows another preferred embodiment of the present invention. Compared to FIG. 4, the termination area in FIG. 5 has an additional n* doped region 203' next to the body region 204 near the top surface of the epitaxial layer 201. The n* region 203' is formed due to the ion implantation for the trench bottom doped region 203.

Figure 6:
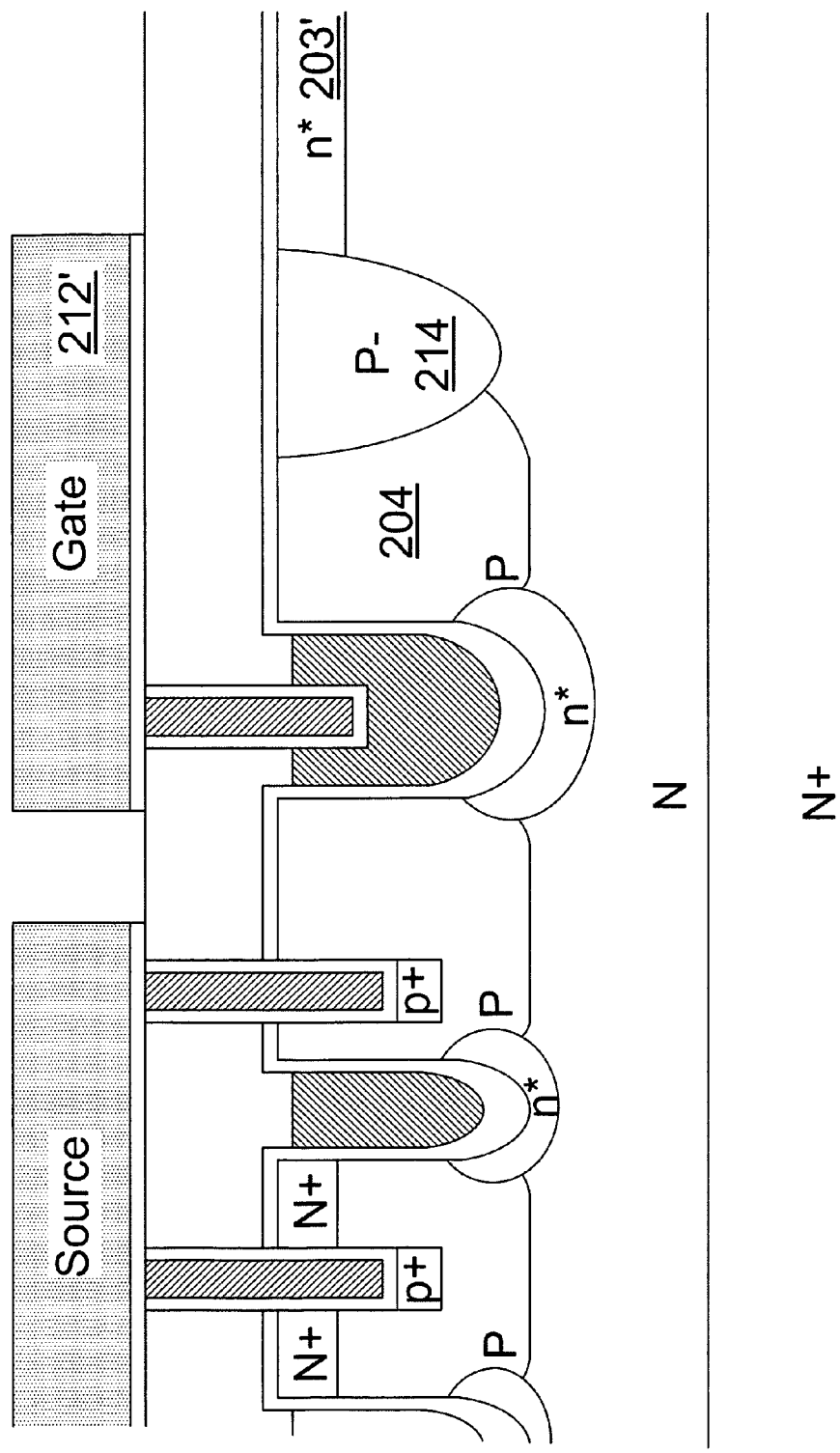
FIG. 6 is a side cross-sectional view of a shallow trench MOSFET of another embodiment according to the present invention.

FIG. 6 shows another preferred embodiment of the present invention. Compared to FIG. 5, the termination area in FIG. 6 has a p– guard ring 214 between the n* doped region 203' and the P body region 204 underneath the field metal plate which is also serving as the gate metal 212'.

Figure 7D:
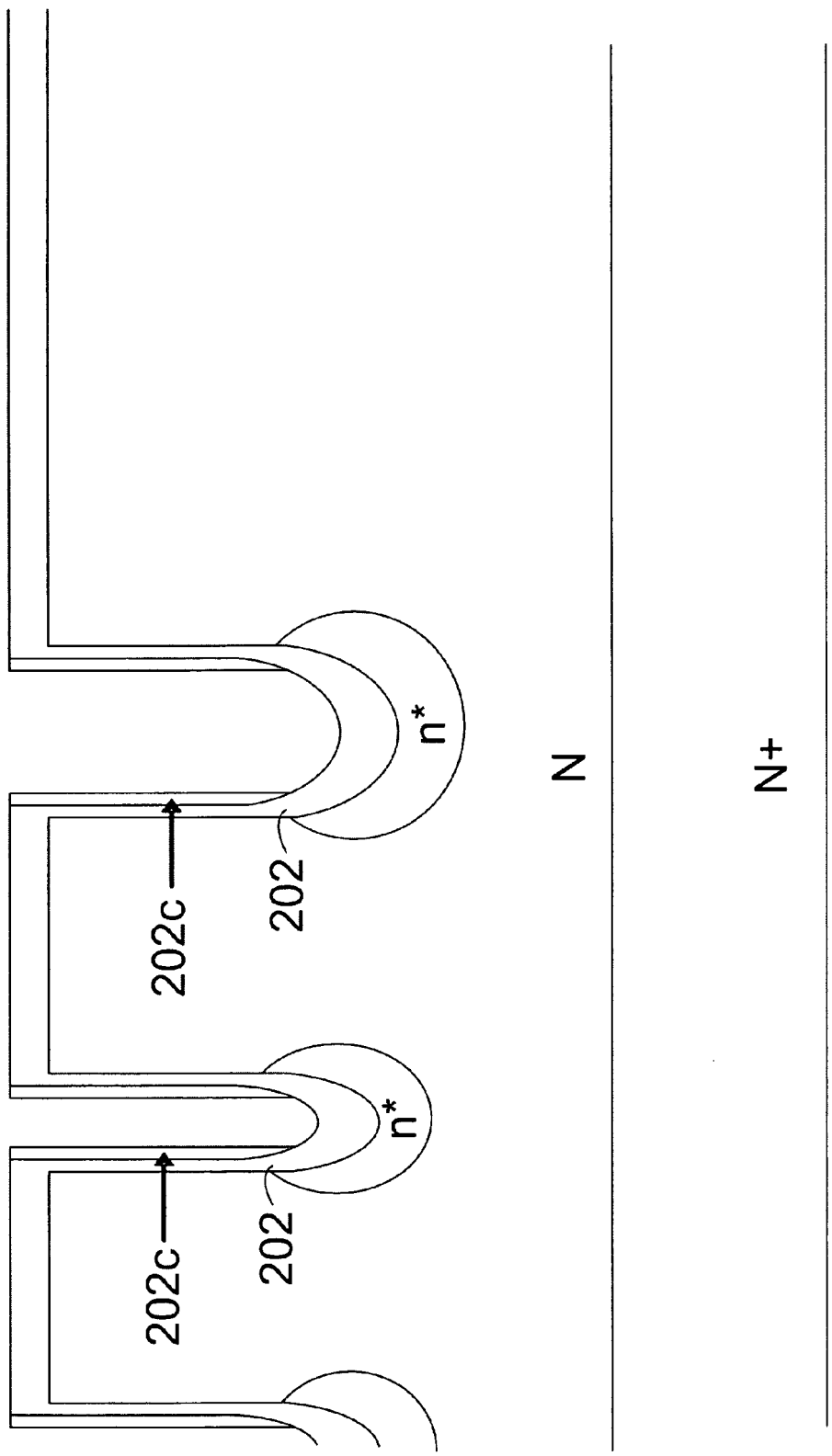

FIGS. 7A to 7H show a series of exemplary steps that are performed to form the inventive trench MOSFET shown in FIG. 4. In FIG. 7A, an N doped epitaxial layer 201 is grown on an N+ doped substrate 200. A hard mask (oxide or oxide/nitride/oxide) is deposited onto the N epitaxial layer 201. Thereafter, a trench mask (not shown) is applied onto the hard mask for the formation of a plurality of gate trenches 210a and at least a wider gate trench 211a by a successively hard mask etching, photo-resist removing and dry silicon etching, wherein the shallow trench 211a has a greater trench width than the shallow trench 211a. After all the gate trenches are opened to a certain depth, in FIG. 7B, a sacrificial oxide (not shown) is grown and then removed to eliminate the plasma damage introduced during opening those gate trenches. Then, a layer of screen oxide is grown for a followed As ion implantation to form an n* doped region 203 underneath each of the gate trenches with a doping concentration heavier than that of the epitaxial layer 201 to further reduce Rds. Next, in FIG. 7C, after the screen oxide and the hard mask removal, a thin gate oxide 202a, a layer of un-doped poly silicon or amorphous silicon 202b and a nitride layer 202c are successively deposited along the front surface of the epitaxial layer 201 and the inner surface of the gate trenches 210a and 211a. Then, a nitride anisotropic nitride etch is carried out to leave the nitride layer 202c only on the sidewalls of the gate trenches 210a and 210b.

Figure 7E:
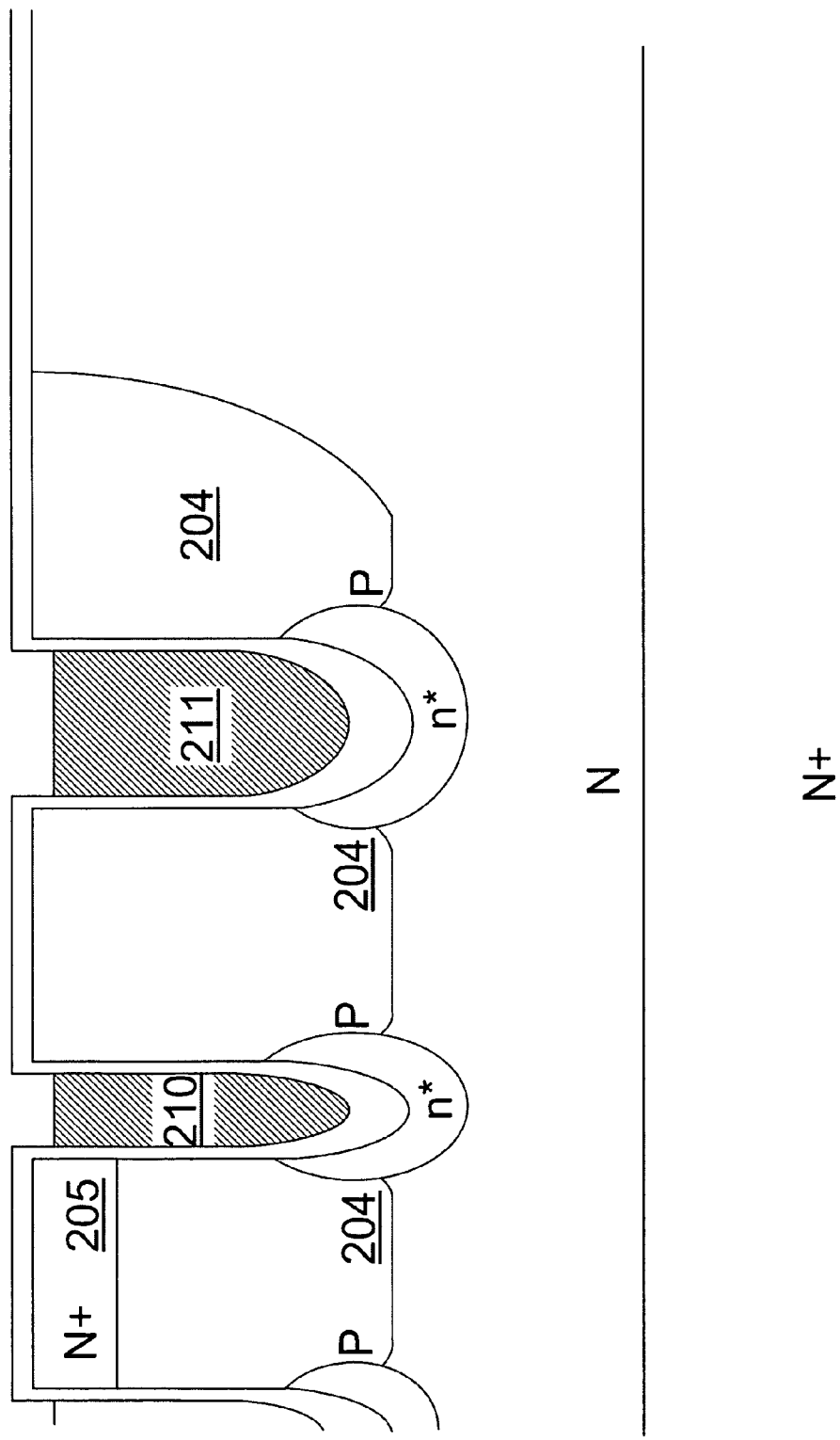

In FIG. 7D, a step of oxidation is performed for oxidizing the un-doped poly silicon or amorphous silicon 202b (as shown in FIG. 7C) only on gate trench bottoms and the top surface of the epitaxial layer due to be blocked by the nitride layer 202c the sidewalls of the gate trenches. Thus, the oxide layer 202 with a thick trench bottom is implemented. In FIG. 7E, after removing the nitride layer 202c, all the gate trenches are filled with a doped poly silicon layer or a combination of a doped poly silicon and a non-doped poly silicon layer and followed by a poly CMP (Chemical Mechanical Polishing) or plasma etching back to form trenched gates 210 and at least a wider trenched gate 211 for gate connection on which a layer of silicide (not shown) are formed as an alternative step for low Rg (gate resistance). Then, after applying a body mask (not shown), an ion implantation of a second conductivity doping type is carried out to form a P-body region 204. After that, the oxide layer along the top surface of the epitaxial layer is etched back to 100~400 Å. Then, the process continues by applying an N+ source mask (not shown), and carrying out an ion implantation of the first conductivity doping type and driving in (or no driving in as alternative for shallower source) for the formation of an N+ source region 205 near the top surface of the P body region 204.

Figure 7F:
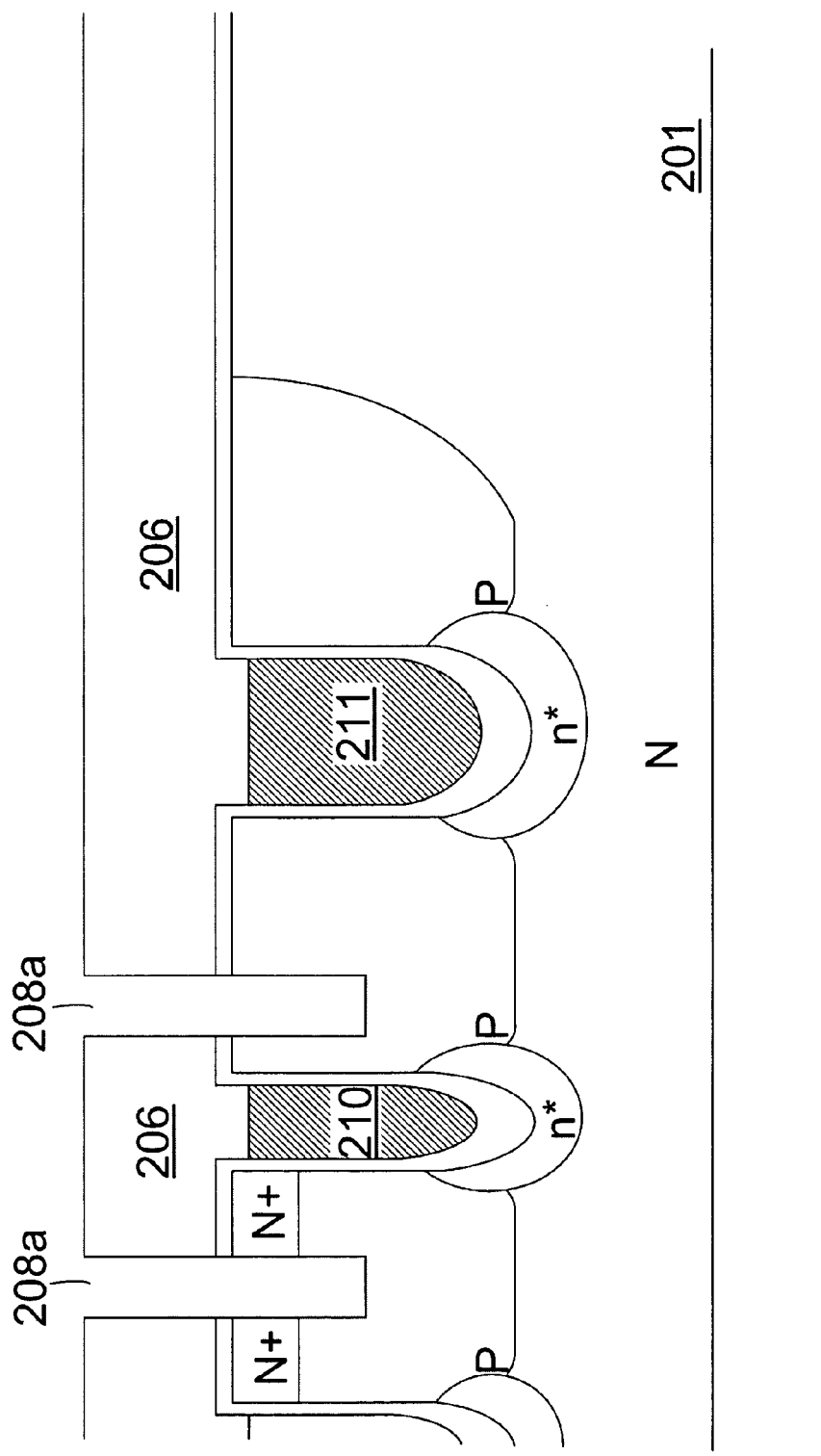
Figure 7G:
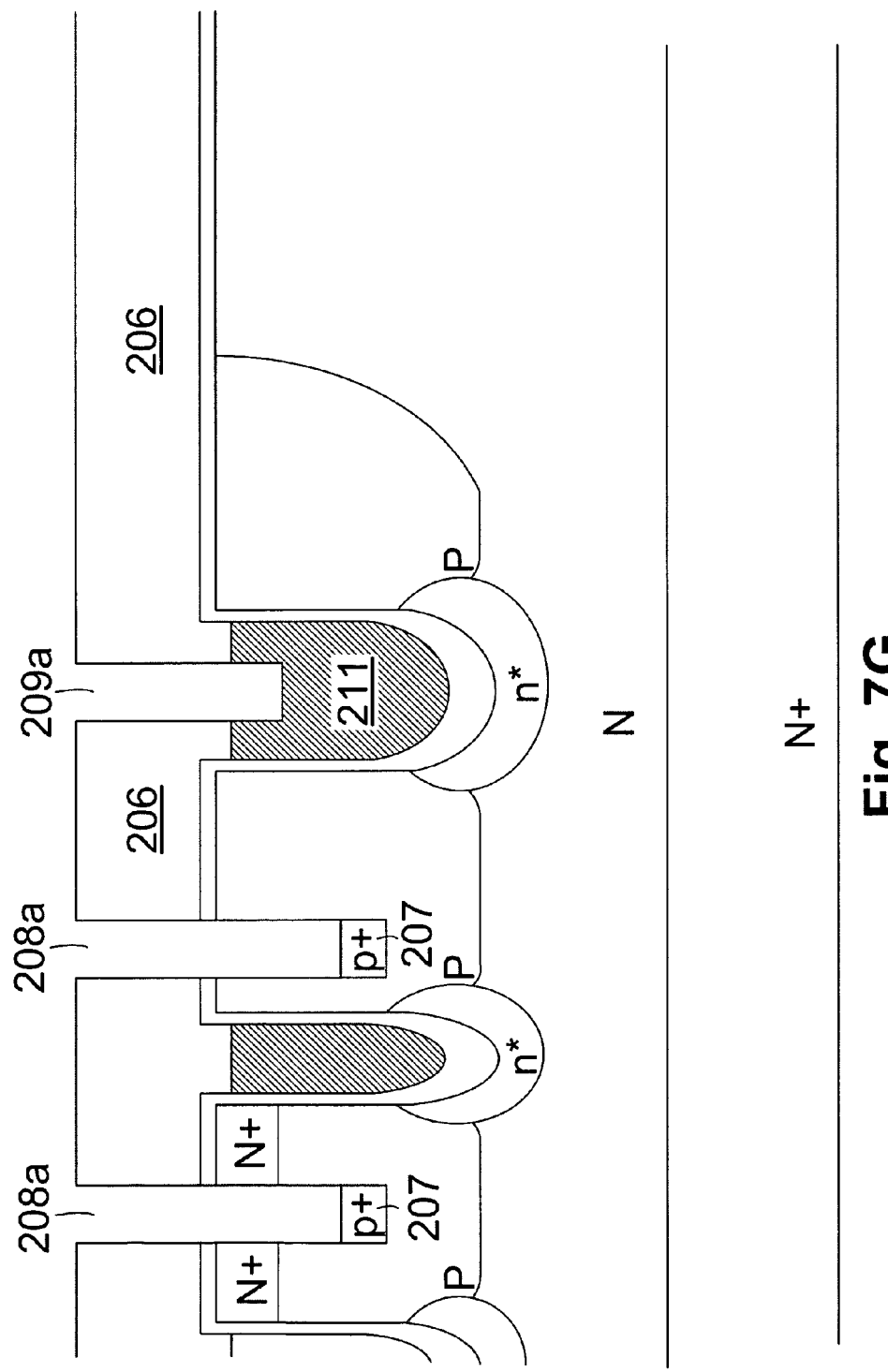
Figure 7H:
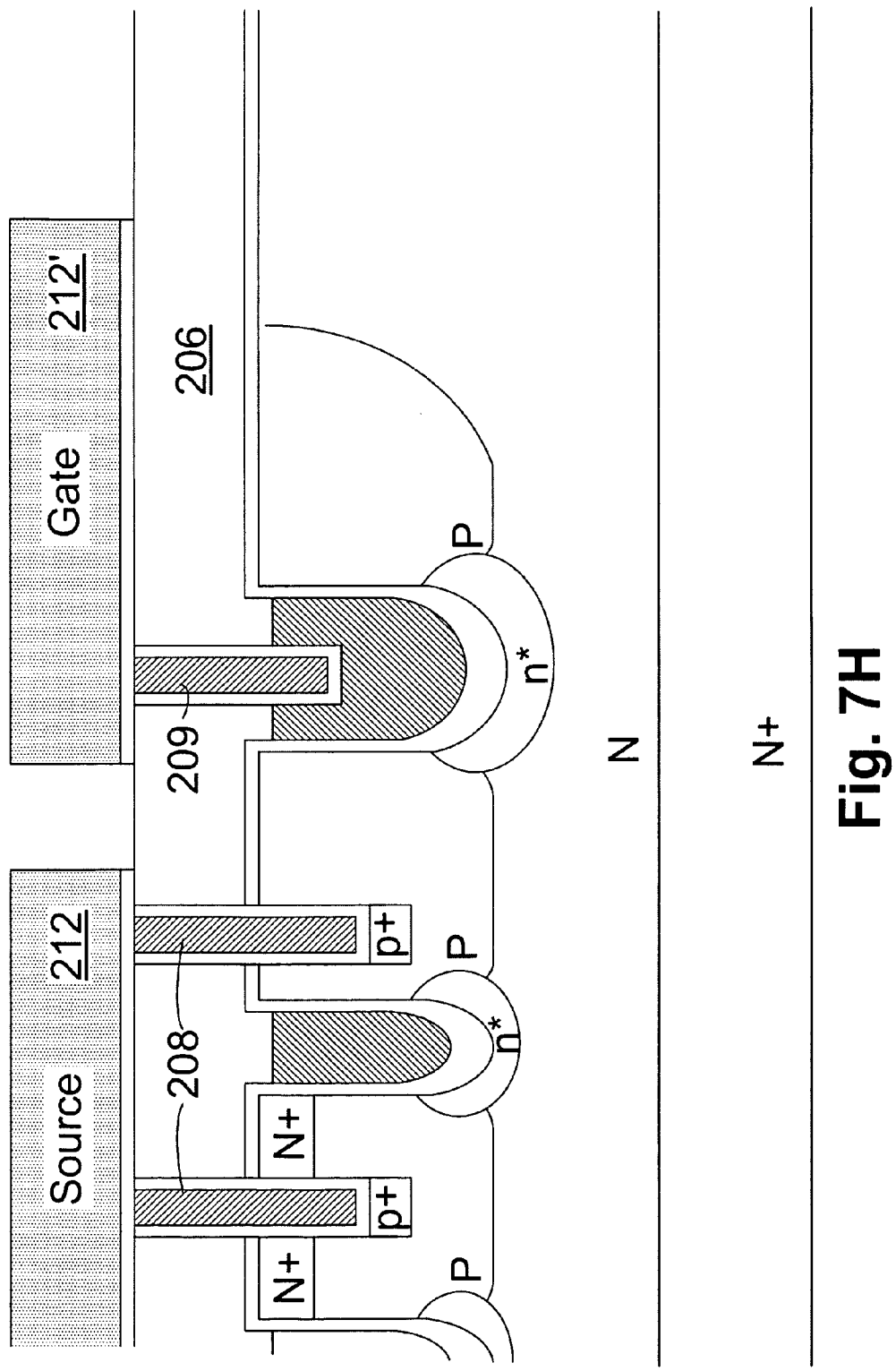

In FIG. 7F, a second insulation layer 206, for example, an oxide layer, is deposited covering the top surface of the epitaxial layer 201 and the trenched gates 210 and the at least a wider trenched gate 211. Then, by applying a source-body contact mask (not shown), a dry oxide etch and dry silicon etch through the second insulation layer 206 and the N+ source region are carried out successively to form source-body contact trenches 208a into the P-body region. In FIG. 7G, after the removal of the source-body contact mask, a gate contact mask (not shown) is applied and followed by a successively dry oxide etch and dry poly-silicon etch to form a gate contact trench 209a extending into the at least a wider trenched gate 211. Then, above the second insulation layer 206, a BF2 ion implantation is carried out to form a p+ body contact region 207 underneath each the source-body contact trench 208a and followed by a step of a RTA (Rapid Thermal Annealing) to active the BF2 dopants. In FIG. 7H, a barrier layer of Ti/TiN or Co/TiN or Ta/TiN is deposited along the inner surface of all the contact trenches and the top surface of the second insulation layer 206, on which metal W layer is deposited to fill all the contact trenches and then etched back to form trenched source-body contact metal plugs 208 and a trenched gate contact metal plug 209. Then, Al alloys padded with a resistance-reduction layer Ti or Ti/TiN is deposited covering the top surface of the second insulation layer 206, the trenched source-body contact metal plugs 208 and the trenched gate contact metal plug 209 and then patterned by a metal mask (not shown) to form a source metal 212 and a gate metal 212', respectively.

Figure 8A:
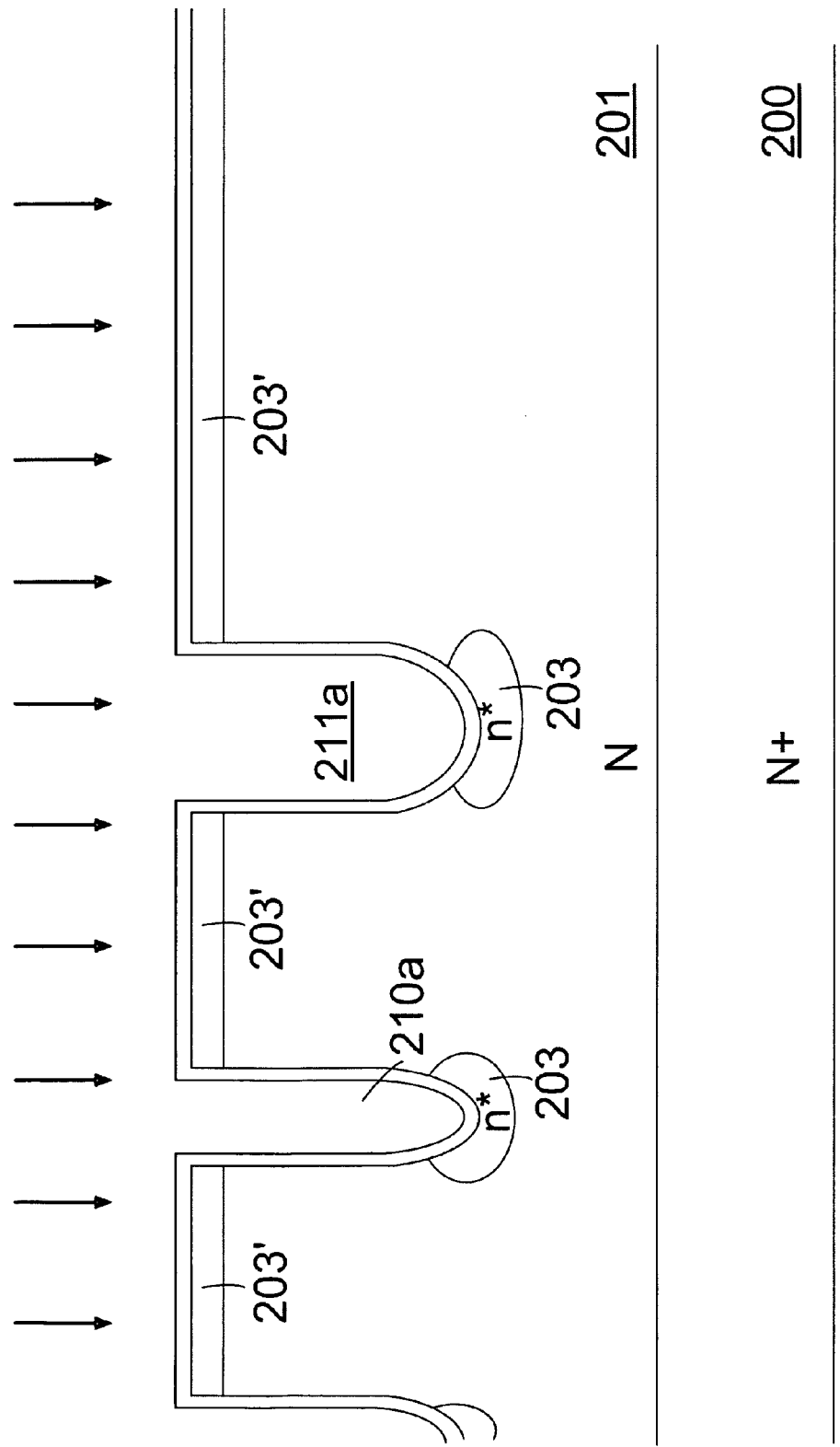
FIGS. 8A to 8B are a serial of side cross sectional views for showing a few processing steps for fabricating a shallow trench MOSFET as shown in FIG. 5.
Figure 8B:
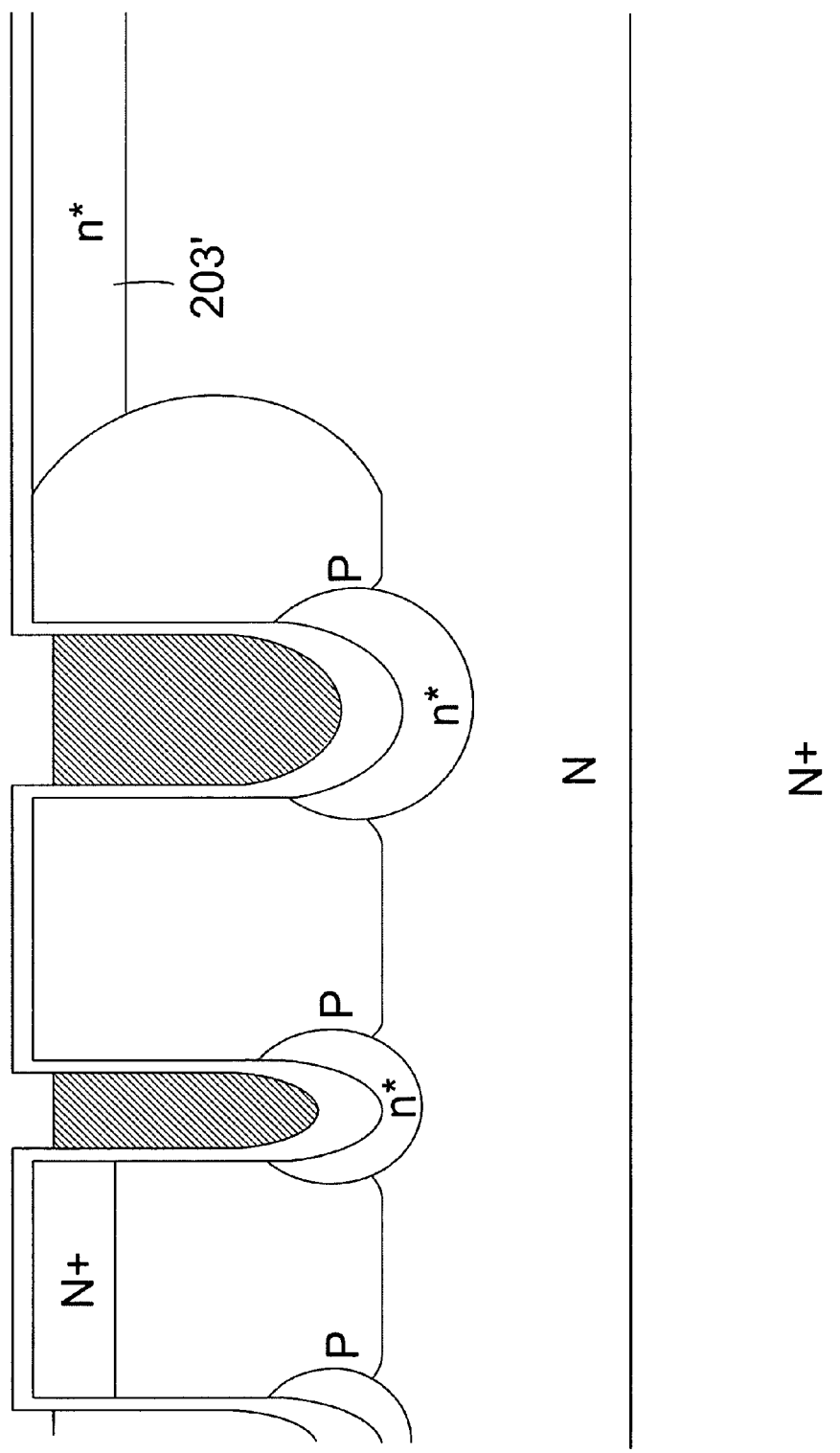

FIGS. 8A to 8B show a few steps for showing the processing steps for fabricating the trench MOSFET in FIG. 5. In FIG. 8A, an N doped epitaxial layer 201 is grown on an N+ doped substrate 200. A hard mask (oxide or oxide/Nitride/oxide) is deposited onto the epitaxial layer 201. Then, a trench mask (not shown) is applied onto the hard mask for the formation of a plurality of gate trenches 210a and at least a wider gate trench 211a by a successively hard mask etching, photo-resist removing and dry silicon etching. Thereafter, the hard mask is removed, which is different from the process flow of making the structure in FIG. 4. Then, a sacrificial oxide (not shown) is grown and then removed to eliminate the plasma damage introduced during opening those gate trenches. Then, a layer of screen oxide is grown for the followed As ion implantation to form an n* doped region 203 underneath each of the gate trenches and an n* doped region 203' on a top surface of the epitaxial layer with a doping concentration heavier than that of the epitaxial layer 201.

Next, in FIG. 8B, after the screen oxide removal, the process flow is similar to that of making the structure in FIG. 4 till the formation of a metal pad layer. The n* doped region 203' is left in a termination area due to the hard mask removal before the screen oxide is grown.

FIG. 9 shows a few steps for fabricating the structure in FIG. 6. Compared to FIG. 8B, after the formation of the trenched gates, a guard ring mask is applied to define a guard ring and followed by a guard ring ion implantation for the formation of a P– guard ring 214 between the body region 204 and the n* doped region 203' before applying the P– body mask.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

The invention claimed is:

1. A method for making a trench MOSFET with a thick trench bottom oxide, comprising:
   forming a plurality of gate trenches in an epitaxial layer of a first conductivity doping type;
   forming a first insulation layer along an inner surface of said gate trenches and a top surface of said epitaxial layer;
   depositing a layer of un-doped poly silicon or amorphous silicon onto said first insulation layer;
   depositing a nitride layer onto said un-doped poly silicon or amorphous silicon and carrying out a nitride anisotropic etching to leave said nitride layer only on sidewalls of said gate trenches;
   oxidizing said un-doped poly silicon or amorphous silicon on bottoms of said gate trenches to form said thick trench bottom oxide having thickness greater than said first insulation layer along the sidewalls of said gate trenches; and
   removing said nitride layer from the sidewalls of said gate trenches.

2. The method of claim 1, wherein said un-doped poly silicon is deposited at 650° C. or above.

3. The method of claim 1, wherein said un-doped amorphous silicon is deposited below 650° C.

4. The method of claim 1, wherein before forming said first insulation layer, further comprises:
   depositing a layer of hard mask covering said epitaxial layer over a substrate layer;

applying a trench mask onto said hard mask, and etching said hard mask and said epitaxial layer to form said gate trenches;

growing a sacrificial oxide along the inner surface of said gate trenches and then removing said sacrificial oxide;

forming a screen oxide along the inner surface of said gate trenches and carrying out an ion implantation to form doped regions of said first conductivity doping type around the bottoms of said gate trenches with doping concentration heavier than said epitaxial layer; and removing said screen oxide and said hard mask.

5. The method of claim 1, wherein before forming said first insulation layer, further comprises:

depositing a layer of hard mask covering said epitaxial layer over a substrate layer;

applying a trench mask onto said hard mask, and etching said hard mask and said epitaxial layer to form said gate trenches;

removing said hard mask;

growing a sacrificial oxide along the inner surface of said gate trenches and then removing said sacrificial oxide;

forming a screen oxide along the inner surface of said gate trenches and carrying out an ion implantation to form doped regions around the bottoms of said gate trenches and near the top surface of said epitaxial layer; and removing said screen oxide.

6. The method of claim 1, wherein after removing said nitride layer, further comprises:

depositing a doped poly silicon layer or a combination of a doped poly silicon layer and a non-doped poly silicon layer to fill said gate trenches and then etching back to form a plurality of trenched gates.

7. The method of claim 6, wherein after forming said trenched gates, further comprises:

applying a body mask;

carrying out a body dopant ion implantation and driving-in said body dopant to form a body region of a second conductivity doping type;

applying a source mask; and carrying out a source dopant ion implantation.

8. The method of claim 7, wherein after carrying out said source dopant ion implantation, further comprises:

depositing a second insulation layer covering the top surface of said epitaxial layer and said trenched gates;

applying a source-body contact mask, and etching through said second insulation layer and said source region, and extending into said body region to form source-body contact trenches;

applying a gate contact mask and etching through said second insulation layer and extending into at least one of said trenched gates to form gate contact trench;

carrying out a body contact dopant ion implantation to form a heavily doped body contact region of said second conductivity doping type underneath each of said source-body contact trenches and activating said body contact dopant by a RTA;

depositing a barrier layer of Ti/TiN or Co/TiN or Ta/TiN and W metal successively and then etching back to form a metal plug in each of said source-body contact trenches and said gate contact trench; and depositing a resistance-reduction layer Ti or Ti/TiN and a metal layer of Al alloys or Cu, and patterning by applying a metal mask to form a source metal and a gate metal, respectively.

9. The method of claim 7, wherein after forming said trenched gates and before applying said body mask, further comprises applying a guard ring mask and carrying out an ion implantation to form a guard ring of said second conductivity doping type in a termination area.

10. The method of claim 7 further comprises driving-in said source dopant after carrying out said source dopant ion implantation.

11. The method of claim 8, wherein said gate metal also serves as a field metal plate beyond said body region and overlaps said epitaxial layer ranging from 2 to 10 µm.

12. A method for making a trench MOSFET, comprising:

depositing a hard mask covering an epitaxial layer of a first conductivity doping type over a substrate layer;

applying a trench mask onto said hard mask, and etching said hard mask and said epitaxial layer to form a plurality of gate trenches;

growing a sacrificial oxide along an inner surface of said gate trenches and then removing said sacrificial oxide;

forming a screen oxide along the inner surface of said gate trenches and carrying out an ion implantation to form doped regions of said first conductivity doping type around bottoms of said gate trenches with doping concentration heavier than said epitaxial layer;

removing said screen oxide and said hard mask;

forming a first insulation layer as a gate oxide along the inner surface of said gate trenches and a top surface of said epitaxial layer;

depositing a layer of un-doped poly silicon or amorphous silicon onto said first insulation layer;

depositing a nitride layer onto said un-doped poly silicon or amorphous silicon and carrying out a nitride anisotropic etching to leave said nitride layer only on sidewalls of said gate trenches;

oxidizing said un-doped poly silicon or amorphous silicon on the bottoms of said gate trenches and the top surface of said epitaxial layer; and removing said nitride layer from the sidewalls of said gate trenches.

13. A method for making a trench MOSFET, comprising:

depositing a hard mask covering an epitaxial layer of a first conductivity doping type over a substrate;

applying a trench mask onto said hard mask, and etching said hard mask and said epitaxial layer to form a plurality of gate trenches;

removing said hard mask;

growing a sacrificial oxide along an inner surface of said gate trenches and then removing said sacrificial oxide;

forming a screen oxide along the inner surface of said gate trenches and carrying out an ion implantation to form doped regions of said first conductivity doping type around bottoms of said gate trenches with doping concentration heavier than said epitaxial layer;

removing said screen oxide;

forming a first insulation layer along the inner surface of said gate trenches and the top surface of said epitaxial layer;

depositing a layer of un-doped poly silicon or amorphous silicon onto said first insulation layer;

deposing a nitride layer onto said un-doped poly silicon or amorphous silicon and carrying out a nitride anisotropic etching to leave said nitride layer only on sidewalls of said gate trenches;

oxidizing said un-doped poly silicon or amorphous silicon on the bottoms of said gate trenches and the top surface of said epitaxial layer;

removing said nitride layer from the sidewalls of said gate trenches;

depositing a doped poly silicon layer or a combination of a doped poly silicon layer and a non-doped poly silicon layer to fill said gate trenches and then etching back to form a plurality of trenched gates;

applying a body mask, and carrying out a body dopant ion implantation and driving-in said body dopant to form a body region of a second conductivity doping type;

applying a source mask and carrying out a source dopant ion implantation to form a source region of said first conductivity doping type;

depositing a second insulation layer covering the top surface of said epitaxial layer and said trenched gates;

applying a source-body contact mask, and etching through said second insulation layer and said source region, and extending into said body region to form source-body contact trenches; and applying a gate contact mask, and etching through said second insulation layer and extending into at least one of said trenched gates to form gate contact trench.

* * * * *